United States Patent
Lepercq et al.

(10) Patent No.: US 10,169,505 B2
(45) Date of Patent: Jan. 1, 2019

(54) PARTITIONING AND ROUTING MULTI-SLR FPGA FOR EMULATION AND PROTOTYPING

(71) Applicant: Synopsys, Inc., Mountain View, CA (US)

(72) Inventors: Etienne Lepercq, Marlborough, MA (US); Alexander Rabinovitch, Shrewsbury, MA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 15/184,266

(22) Filed: Jun. 16, 2016

(65) Prior Publication Data
US 2017/0364621 A1 Dec. 21, 2017

(51) Int. Cl.
*G06F 17/50* (2006.01)

(52) U.S. Cl.
CPC ........ *G06F 17/5036* (2013.01); *G06F 17/505* (2013.01); *G06F 17/5022* (2013.01); *G06F 17/5027* (2013.01); *G06F 17/5072* (2013.01); *G06F 17/5077* (2013.01)

(58) Field of Classification Search
CPC .............. G06F 17/5077; G06F 17/505; G06F 17/5054; G06F 17/5036; G06F 17/5022; G06F 17/5027; G06F 17/5072
USPC .............. 716/116, 106, 108, 126, 128, 131; 703/23, 28
See application file for complete search history.

(56) References Cited

U.S. PATENT DOCUMENTS

| 6,009,258 A * | 12/1999 | Elliott ................. G06F 11/1438 703/22 |
| 2004/0194048 A1* | 9/2004 | Arnold .................. G06F 17/505 716/116 |

OTHER PUBLICATIONS

Large FPGA Methodology Guide Xilinx document No. UG872 (v13.4) Jan. 18, 2012.

* cited by examiner

*Primary Examiner* — Stacy Whitmore
(74) *Attorney, Agent, or Firm* — Alston & Bird LLP

(57) ABSTRACT

A computer-implemented method for configuring a hardware verification system includes receiving, in the computer, a first data representative of a first design. The method further includes performing a first mapping of the first data to generate a second data in accordance with a first cost function and one or more first delays each associated with a different one of a first multitude of paths. One of the first multitude of paths includes a critical path characterized by a second delay. The method further includes performing a second mapping of the second data to generate a third data in accordance with a second cost function and a multitude of third delays each associated with a different one of a second multitude of paths and the second delay. The method further includes compiling the third data for configuring the hardware verification system.

25 Claims, 8 Drawing Sheets

PARTITIONING AND ROUTING MULTI-SLR FPGA FOR EMULATION AND PROTOTYPING

BACKGROUND

The present disclosure relates generally to testing a circuit design, and more specifically to testing such circuit using a programmable emulation tool having improved performance.

Integrated circuit (IC) designers commonly describe their designs in hardware description language (HDL) such as Verilog, VHDL, SystemC, and the like. In IC design, hardware emulation may refer to the process of replicating behavior of one or more pieces of hardware, hereinafter also referred to as a design under test (DUT), with another piece of hardware, such as a special-purpose emulation system. An emulation model is usually generated in accordance with a hardware description language source code representing the design under test. The emulation model is compiled into a format used to program the emulation system. Running the emulation system that has been programmed enables debugging and functional verification of the design under test. Overall progress of the emulation is usually controlled by a master clock signal generated on the emulator hardware, when the emulation hardware is run.

With recent advances in technology, circuit designs and systems including field programmable gate arrays (FPGA) are becoming more and more complex. The compilation of data for emulation or prototyping systems that include the more complex FPGA systems relies in-part on compilation software provided by the FPGA manufacturer, which may not comprehend certain optimizations that may improve speed performance of the emulator or prototyping hardware. Therefore, there is a need in the art for improving speed performance of hardware emulation systems using the complex FPGA technology.

SUMMARY

According to one embodiment of the present invention, a computer-implemented method for configuring a hardware verification system is presented. The method includes receiving, in the computer, a first data representative of a first design, when the computer is invoked to configure the verification system. The method further includes performing a first mapping, using the computer, of the first data to generate a second data in accordance with a first cost function and one or more first delays each associated with a different one of a first multitude of paths. One of the first multitude of paths includes a critical path characterized by a second delay. The method further includes performing a second mapping, using the computer, of the second data to generate a third data in accordance with a second cost function and a multitude of third delays each associated with a different one of a second multitude of paths and the second delay. The method further includes compiling, using the computer, the third data for configuring the hardware verification system.

According to one embodiment, the first mapping is an operation selected from the group consisting of partitioning, and routing. According to one embodiment, the second mapping is an operation selected from the group consisting of partitioning, and routing.

According to one embodiment, the method further includes computing, using the computer, the multitude of third delays in accordance with the one or more first delays, the second delay, and the first mapping such that a subset of the multitude of third delays is each increased from the associated different one or more first delays without exceeding the second delay. According to one embodiment, the third data includes a functionality of the first design.

According to one embodiment, the second data includes at least a first logic circuit and a subset of the first multitude of paths is disposed across the first logic circuit, the first cost function being associated with conserving the number of a multitude of interconnects that interface with the first logic circuit. According to one embodiment, the first logic circuit includes a multitude of second logic circuits selected from the group consisting of field programmable gate arrays (FPGA), configurable hardware logic (CHL), and super logic region (SLR).

According to one embodiment, performing the second mapping includes assigning the critical path to one of a multitude of interconnects without using time multiplexing. According to one embodiment, the second delay is associated with a maximum speed of the hardware verification system. According to one embodiment, performing the second mapping includes assigning a subset of the second multitude of paths other than the critical path to one of a multitude of interconnects using time multiplexing in accordance with the multitude of third delays without exceeding the second delay.

According to one embodiment, the third data includes a second logic circuit and a third logic circuit disposed in the first logic circuit, the second cost function being associated with conserving the number of a multitude of interconnects between the second logic circuit and the third logic circuit. According to one embodiment, the second logic circuit is a first super logic region (SLR) and the third logic circuit is a second SLR different from the first SLR. According to one embodiment, a subset of the second multitude of paths is disposed so as to cross between the second logic circuit and the third logic circuit.

According to one embodiment of the present invention, a non-transitory computer-readable storage medium comprising instructions, which when executed by a computer, cause the computer to receive a first data representative of a first design, when the computer is invoked to configure the verification system. The computer is further caused to perform a first mapping of the first data to generate a second data in accordance with a first cost function and one or more first delays each associated with a different one of a first multitude of paths, wherein one of the first multitude of paths includes a critical path characterized by a second delay. The computer is further caused to perform a second mapping of the second data to generate a third data in accordance with a second cost function and a multitude of third delays each associated with a different one of a second multitude of paths and the second delay. The computer is further caused to compile the third data for configuring the hardware verification system.

According to one embodiment, the computer is further caused to compute the multitude of third delays in accordance with the one or more first delays, the second delay, and the first mapping such that a subset of the multitude of third delays is each increased from the associated different one or more first delays without exceeding the second delay.

According to one embodiment of the present invention, a computer system is operative to receive a first data representative of a first design, when the computer is invoked to configure the verification system. The system is further operative to perform a first mapping of the first data to generate a second data in accordance with a first cost function and one or more first delays each associated with a different one of a first multitude of paths, wherein one of the first multitude of paths includes a critical path characterized by a second delay. The system is further operative to perform a second mapping of the second data to generate a third data in accordance with a second cost function and a multitude of third delays each associated with a different one of a second multitude of paths and the second delay. The system is further operative to compile the third data for configuring the hardware verification system.

According to one embodiment, the computer system is further operative to compute the multitude of third delays in accordance with the one or more first delays, the second delay, and the first mapping such that a subset of the multitude of third delays is each increased from the associated different one or more first delays without exceeding the second delay.

A better understanding of the nature and advantages of the embodiments of the present invention may be gained with reference to the following detailed description and the accompanying drawings.

DETAILED DESCRIPTION

The term "programmable device" is used herein to refer to an integrated circuit designed to be configured and/or reconfigured after manufacturing. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks can be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

Figure 1:
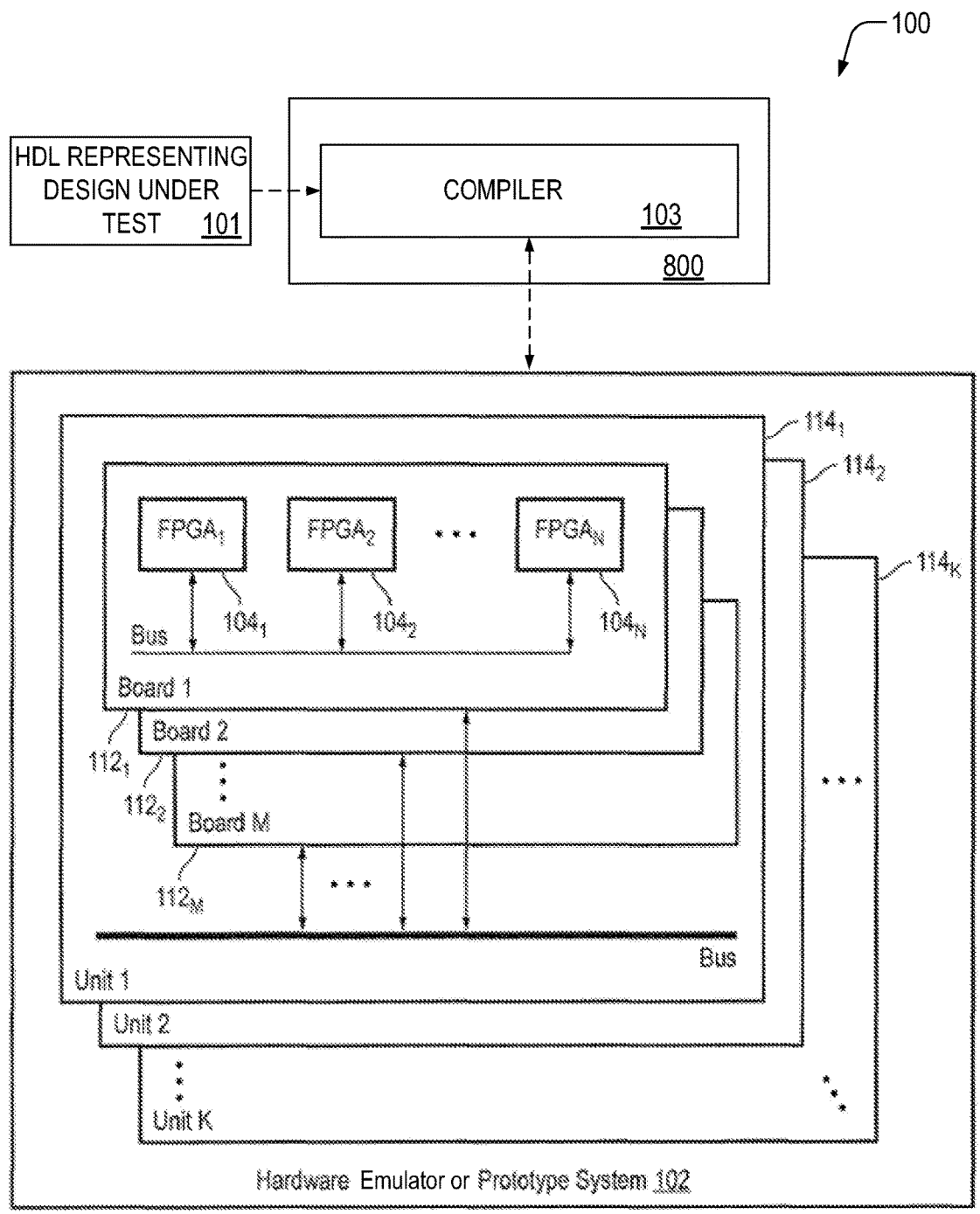
FIG. 1 depicts an exemplary high level block diagram of a hardware emulation or prototype system, in accordance with one embodiment of the present invention.

Hardware emulation and/or prototyping systems may utilize one or more programmable devices. FIG. 1 is an exemplary high-level block diagram of a hardware verification system 100, in accordance with one embodiment of the present invention. Hardware verification system 100 may be used to verify, test or debug a circuit design. Hardware verification system 100 may include a hardware emulator and/or prototype system 102, hereinafter also referred to as a hardware verification system, and a computer system 800 that is described in reference to FIG. 8. As depicted in FIG. 1, hardware emulator and/or prototype system 102 may be coupled to computer system 800, which may include a compiler 103 module that may receive a hardware description language code representing a design under test 101, hereinafter also referred to as "design under test," "circuit design," or "design."

Compiler 103 may include a multitude of various software modules that may or may not include a dedicated compiler module, however for the purposes of this description may be referred to simply as "compiler." Compiler 103 may transform, change, reconfigure, add new functions to, and/or control the timing of design under test 101 that facilitate verification, emulation, or prototyping of design under test 101. Further, compiler 103 may compile the code or data representing design under test 101 and any associated changes into a binary image used to program the hardware primitives disposed in hardware emulator and/or prototype system 102. Thereby, the logical functions and timing of design under test 101, hereinafter also referred to as "circuit design," that may ultimately be implemented by hardware in an integrated circuit chip may instead be first implemented in hardware emulator and/or prototype system 102. Among other advantages, verification of the design in hardware may be accomplished at much higher speed than by software verification alone.

Hardware emulator and/or prototype system 102 may include a multitude of programmable processors such as FPGAs $104_1$ through $104_N$, and other blocks (not shown), such as memories, input/output devices, other processors, and the like. The hardware emulation and/or prototype system receives a circuit design, and programs the programmable processors to verify behavior of the circuit design. Hardware emulator and/or prototype system 102 may include a primary or master system clock from which a number of other clock signals can be generated.

Programmable processors FPGAs $104_1$-$104_N$ may be placed into one or more hardware boards $112_1$ through $112_M$. Multiple of such boards can be placed into a hardware unit, e.g. $114_1$. The boards within a unit may be connected using the backplane of the unit or any other types of connections. In addition, multiple hardware units (e.g., $114_1$ through $114_K$) can be connected to each other by cables or any other means to form a multi-unit system. In general, the hardware emulator or prototype system 102 may be made of a single board, a single unit with multiple boards, or multiple units without departing from the teachings of the present disclosure.

Figure 2:
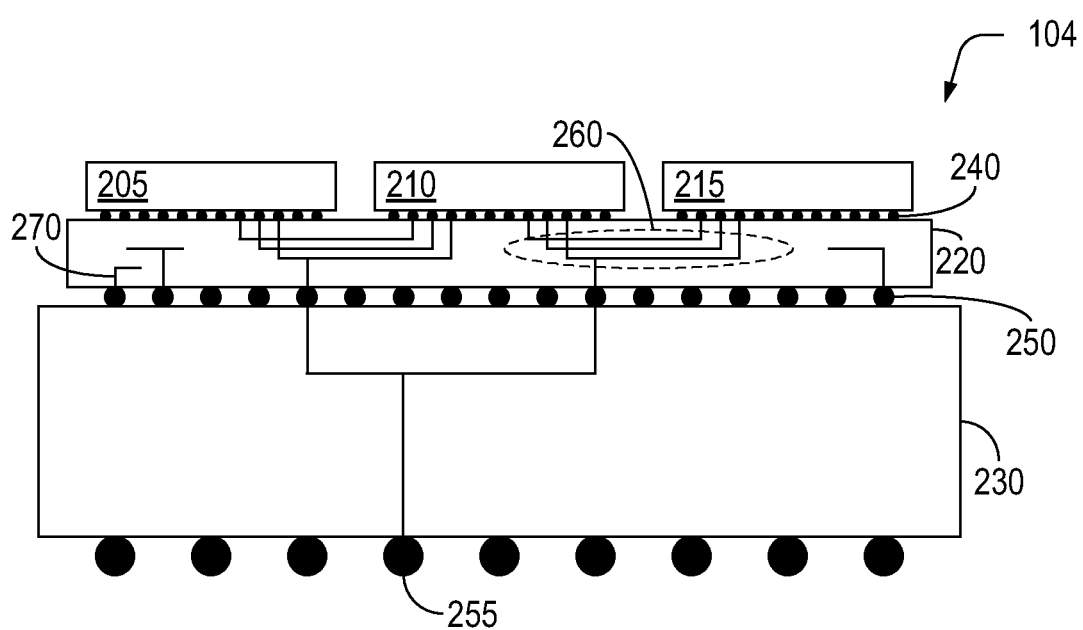
FIG. 2 depicts an exemplary cross section of a FPGA using a multitude of super logic region (SLR) chips that may be used in the hardware emulator or prototype system depicted in FIG. 1.

FIG. 2 depicts an exemplary cross section of a FPGA 104 using a multitude of super logic region (SLR) chips that may be used in the hardware emulator or prototype system 102 depicted in FIG. 1. Referring to FIG. 2, FPGA 104 includes a multitude of super logic region (SLR) chips 205-215, an interposer chip 220, and a package substrate 230. Each one of the multitude of super logic region (SLR) chips 205-215 may be mechanically and electrically connected to interposer chip 220 using a multitude of micro-bumps 240. Interposer chip 220 may be mechanically and electrically connected to package substrate 230 using a multitude of controlled-collapse-chip-connection (C4) bumps 250. Package substrate 230 may be mechanically and electrically connected (not depicted) to one of the one or more hardware boards $112_M$ depicted in FIG. 1 using ball grid array (BGA) solder balls 255.

Interposer chip 220 may include a multitude of physical inter-SLR interconnections 260 depicted generally within the dashed line region that provide electrical signal connections between the multitude of SLR chips 210, 215. Interposer chip 220 may further include a multitude of through-silicon-via (TSV) 270 that may be used to provide signal connections between layers of the multitude of physical interconnections 260 and the multitude of C4 bumps 250.

Each of the multitude of SLR chips 210-215 may utilize FPGA chip architecture thereby providing a much larger FPGA 104 when the multitude of SLR 210-215 are assembled upon interposer chip 220 than as possible for a single monolithic FPGA chip for manufacturing reasons. Although FPGA 104 may be "large" so as to include many more physical logic gates and physical interconnect resources within each of the multitude of SLR 205-215 than previously available within a single monolithic FPGA chip, there are relatively few connections in the multitude of physical inter-SLR interconnections 260, hereinafter also referred to as "channels." Therefore, the scarcity of channels 260 may be a routing bottleneck and may limit runtime speed performance of hardware emulator and/or prototype system 102 depicted in FIG. 1, as will be explained in greater detail below.

The term "net" or "wire" in this context refers to a direct connection in the netlist from one electrical component or terminal to another electrical component or terminal. Component in this context does not refer to merely an electrically conductive connection, but rather an electrical component that performs other electrical functions besides conducting an electrical signal, such as for example switching, or modifying signals as described in the netlist's circuit description. Further, it is understood that when referring to net it is the computer data representing the net and not the physical conductive trace associated with that net that is being described unless a physical connection is specifically called out. For example, a channel (defined below) is a physical connection that may use metal conductors such as traces, pads, or pins to electrically connect between a pair of FPGAs or SLRs. Further, one or more nets, represented as data in a netlist, may be mapped by software in the compiler to physical wire traces in the pair of FPGAs or SLRs and the channel connecting the pair of FPGAs or SLRs in order to conduct electrical signals when the hardware system containing the pair of FPGAs or SLRs is run.

The term "path" in this context refers to data in the netlist representing a portion of the netlist that propagates a datum of digital information during a single clock cycle. An example of a datum of digital information may be an edge transition that may be propagated along a path from one component to another component of the netlist either during simulation or during operation of the hardware emulator and/or prototype system 102. For example, one example of a path may be a first synchronous sequential logic circuit connecting serially to a second synchronous sequential logic circuit, where both first and second synchronous sequential logic circuits are clocked in accordance with the same clock signal, without any other intervening synchronous sequential logic circuits connected between the first and second synchronous sequential logic circuits. A "combinational path" is a path that may further include one or more combinational logic circuits and a multitude of nets connected serially between the first and second synchronous sequential logic circuits and the combinational logic circuits of the path. The path may include at least one net and the path may or may not include combinational logic circuits. The terms net and path are therefore not interchangeable because in one example the path may be serially connected using just one net, while in another example the path may be serially connected using a combinational path that includes a multitude of nets, each net being a portion of the path.

The term "mapped" in this context refers to the operations performed by compiler 103 of partitioning and/or routing circuit design or design under test 101 among and into one or more FPGA and/or SLR. If circuit design 101 is too complex or "large" to be partitioned and/or routed into a single FPGA and/or SLR, then compiler 103 decides how to divide the data representing nets and components represented in the netlist among a multitude of FPGA and/or SLR. The way circuit design 101 is mapped into the FPGA and/or SLR of hardware emulator or prototype system 102 may determine the speed characteristics of the system when the emulator or prototype system is run and may even determine if the mapping operation will or will not converge on a mapping solution in the time available for a given computing resource.

A "channel" in this context refers to a physical electrical connection or communication port on a pair of FPGAs or SLRs. A channel may include communication and control circuitry on each of the FPGAs or SLRs in the pair that are connected by a physical wire in the hardware system. Combinational logic is usually not available outside the FPGA borders. Therefore, any path crossing from one FPGA to another FPGA will usually be represented as a wire or net segment of that path. When data representing a wire is assigned to a channel, then the path associated with that wire is implicitly assigned the same channel since the wire is merely a segment of the associated path. A physical channel or the data representing a channel may or may not have a wire portion of a path assigned to the channel depending on how circuit design 101 is mapped to the hardware emulator and/or prototype system 102, but typically all channels available are assigned to wires because channels are scarce and valuable resources as described below. It is understood that a path is determined by the data representing design 101. Therefore, a path is not determined by the physical medium, e.g. FPGA$_N$ 104$_N$, onto which design 101 is mapped upon. However, the path is subjected to the constraints of FPGA$_N$ 104$_N$ when design 101 is mapped by compiler 103 into hardware emulator or prototype system 102. For example, after design 101 is mapped into hardware emulator or prototype system 102, path P may cross an FPGA boundary multiple times and every time the crossing is done at a net/wire and that net is assigned to cross the FPGA boundary at a channel.

Figure 3A:
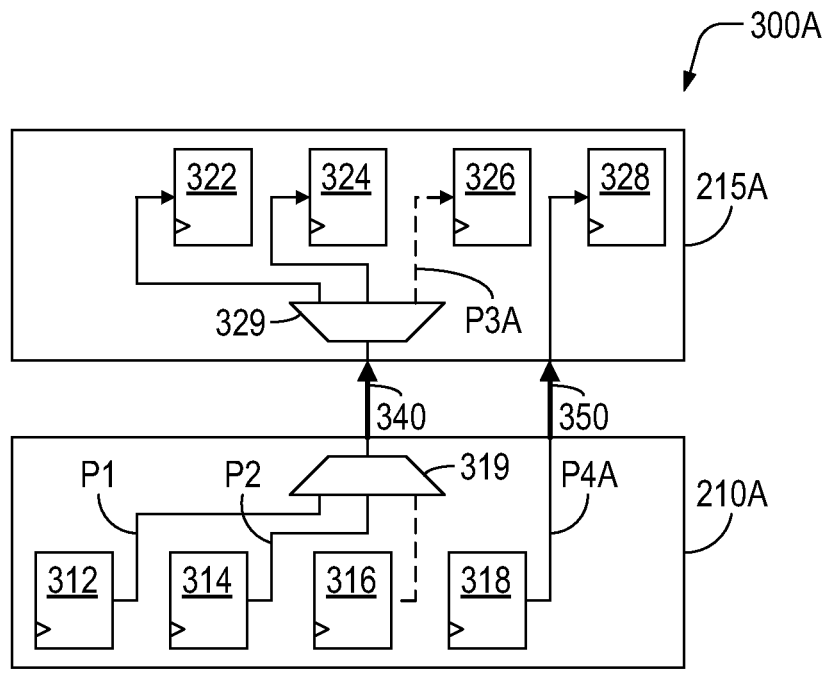
FIG. 3A depicts data representing an exemplary schematic of first portion of a circuit design depicted in FIG. 1 mapped across a multitude of SLR depicted in FIG. 2 such that a critical path uses time domain multiplexing (TDM).

FIG. 3A depicts data representing an exemplary schematic of first portion 300A of circuit design 101 depicted in FIG. 1 mapped across a multitude of SLR 210A, 215A depicted in FIG. 2 such that a critical path P3A uses time domain multiplexing (TDM), which results in potential speed problems described below. Referring to FIG. 3A, schematic of first portion 300A includes data representing a multitude of flip-flops 312-318, and data representing a multiplexer 319 mapped into SLR 210A. Schematic of first portion 300A further includes data representing a multitude of flip-flops 322-328, and data representing a multiplexer 329 mapped into SLR 215A. Schematic of first portion 300A further includes data representing a multitude of channels 340, 350 connecting between SLR 210A and SLR 215A that correspond to the multitude of physical inter-SLR interconnections 260 depicted in FIG. 2. Data representing channel 340 may include multiplexers 319, 329.

Multitude of flip-flops 312-316 are connected to multitude of flip-flops 322-326 respectively using a different one of a multitude of paths P1, P2, P3A, respectively. Because multitude of paths P1, P2, P3A are mapped so as to share the same single channel 340, there is only one physical wire that may carry the signals that multitude of paths P1, P2, P3A transmit. Time domain multiplexing (TDM) is used to keep the signals associated with multitude of paths P1, P2, P3A from interfering with one another. "TDM" in this context refers to allocating the data representing or the physical utilization of a wiring or circuit resource into different distinct time slots. When a channel is depicted as having a multiplexer at both ends of the channel, then TDM is probably being used for that channel. It is understood that how paths are mapped from the netlist representing circuit design 101 to the data representing SLR 210A, SLR 215A and channels 340, 350 is determined by compiler 103. Further compiler 103 may also determine during mapping, which channels are/are not assigned to use TDM as well as which paths and associated wires are/are not assigned to channels using TDM.

It is noted that path P3A, which is depicted as a dashed line, is defined as a "critical path" because the time delay length associated with a critical path dictates a highest speed of hardware emulator or prototype system 102 when the system speed is simulated by compiler 103 or when the emulator or prototype system is run after compilation and programming. There may be more than one critical path.

The use of TDM may conserve the number of available channels between multitude of SLR 210A, 215A, which helps to converge to a solution of the mapping operation. However, the use of TDM on multitude of paths P1, P2, P3A may add significant time delays to the signals associated with those paths. The portions of multitude of paths P1, P2, P3A mapped onto channel 340 may be called "virtual wires." The term "virtual wire" in this context refers to a utilization of a physical communication path segment (wire) during a distinct TDM time slot. For example, three virtual wires are created when channel 340 or single physical wire between pair of SLR 210A, 215A is utilized during three distinct TDM time slots controlled in-part by multiplexers 319, 329.

Flip-flop 318 is connected to flip-flop 328 using a path P4A, which connects from SLR 210A to SLR 215A through channel 350 using a single wire, without sharing any other paths and without having to use TDM, which is noted by the absence of multiplexers at each end of channel 350. Channel 350, which does not use TDM, is faster than channel 340, which does use TDM because hardware emulator or prototype system 102 may have to wait for each of the signals associated with the three virtual wires mapped to channel 340 to complete within a single emulation cycle time. It is noted that mapping critical path P3A to slower channel 340 using TDM may slow down the speed of path P3A and in-turn slow down the speed of hardware emulator or prototype system 102. However, path P4A, which is not a critical path or less critical than path P3A, has been mapped to high speed channel 350 resulting in poor use of a precious higher speed channel 350.

The poor mapping of non-critical path P4A to high speed channel 350 and critical path P3A to a slower channel using TDM may be the result when circuit design 101 does not fit into a single monolithic FPGA chip and is instead mapped across a larger FPGA including a multitude of SLR. Then, limitations in certain compilation software supplied by the multi-SLR FPGA manufacturer that are used by compiler 103 during the data compilation step may not guide the assignment of critical paths to high speed channels in optimized fashion because the local mapping between SLR in the larger FPGA may not comprehend the global mapping and associated timing constraints between the larger FPGA.

In accordance with embodiments of the present invention, a technique is presented that guides the assignment of a multitude of paths each to a different one of a multitude of channels. The channel assignment is biased to assign critical paths to channels not using TDM to maintain high speed for hardware emulator or prototype system 102. The channel assignment is further biased to assign less critical paths to channels that do use TDM to conserve physical and logical channel resources that ensures solution convergence by compiler 103 when design under test 101 is mapped to hardware emulator or prototype system 102. The assignment may be done in a multitude of layers or hierarchies that first comprehends global path mapping and associated delays and then optimally maps paths locally between SLR in a large FPGA. Thereby the less-than-optimal assignment result described in FIG. 3A is less likely to occur and system speed and mapping convergence is improved as described below.

Figure 3B:
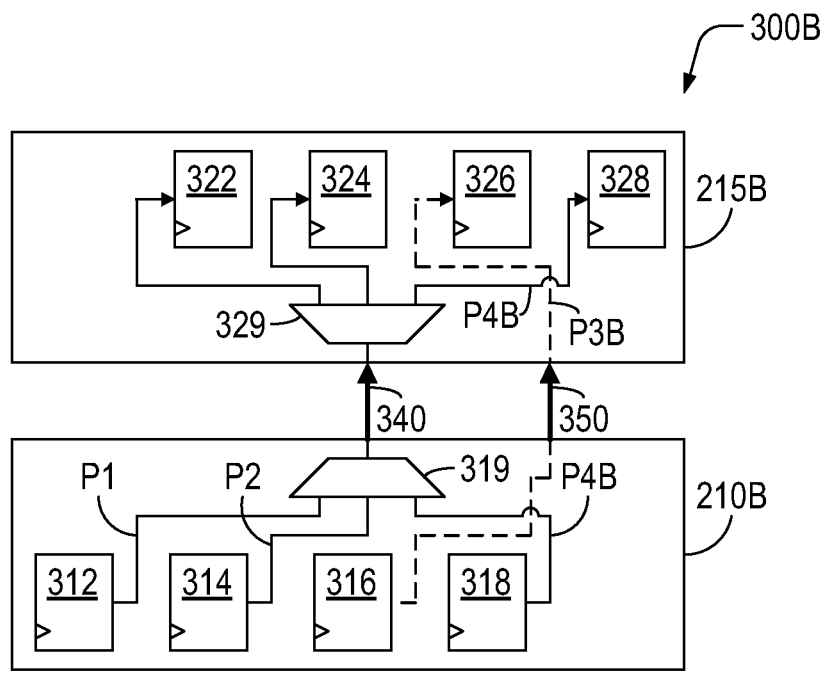
FIG. 3B depicts data representing the exemplary schematic of first portion of the circuit design depicted in FIG. 3A mapped across the multitude of SLR depicted in FIG. 3A such that the critical path does not require time domain multiplexing (TDM), in accordance with one embodiment of the present invention.

FIG. 3B depicts data representing the exemplary schematic of first portion 300B of circuit design 101 depicted in FIG. 3A mapped across the multitude of SLR 210B, 215A depicted in FIG. 3A such that the critical path P3B does not require TDM, in accordance with one embodiment of the present invention. The elements and functions depicted in FIG. 3B are the same as are depicted in FIG. 3A with the following exceptions. Referring to FIG. 3B, critical path 3B, which may still start at flip-flop 316 and end at flip flop 326, is assigned by compiler 103 to channel 350 such that TDM is not used for critical path 3B through channel 350, which greatly improves the speed performance when hardware emulator or prototype system 102 is run after compilation and programming. In other words, channel 350 mapped or assigned to the critical path P3B does not share an assignment as result of mapping by compiler 103 with any other paths.

Less-critical path P4B is mapped or assigned to channel 340, which does use TDM to share channel 340 with multitude of paths P1, P2 without compromising the speed performance when hardware emulator or prototype system 102 is run as will be explained below. Assigning less-than-critical multitude of paths P1, P2, P4B to channel 340 using TDM ensures the mapping procedure used by compiler 103 reaches convergence by selectively assigning paths using TDM based on global as well as local timing constraints and conserves the physical and logical resources of the few available multitude of inter-SLR channels 340, 350 located between multitude of SLR 210B, 215B. In one embodiment compiler 103 may further determine which logical and physical channel is assigned and programmed to use TDM and which channel is not.

It is understood that the descriptions for FIGS. 3A-3B describe just local path assignments within a single large FPGA that includes a multitude of SLR 210B, 215B. However, for compiler 103 to properly comprehend whether a path is a critical path or not compiler 103 considers the timing effects globally for design under test 101 as a whole, as described below.

Figure 4:
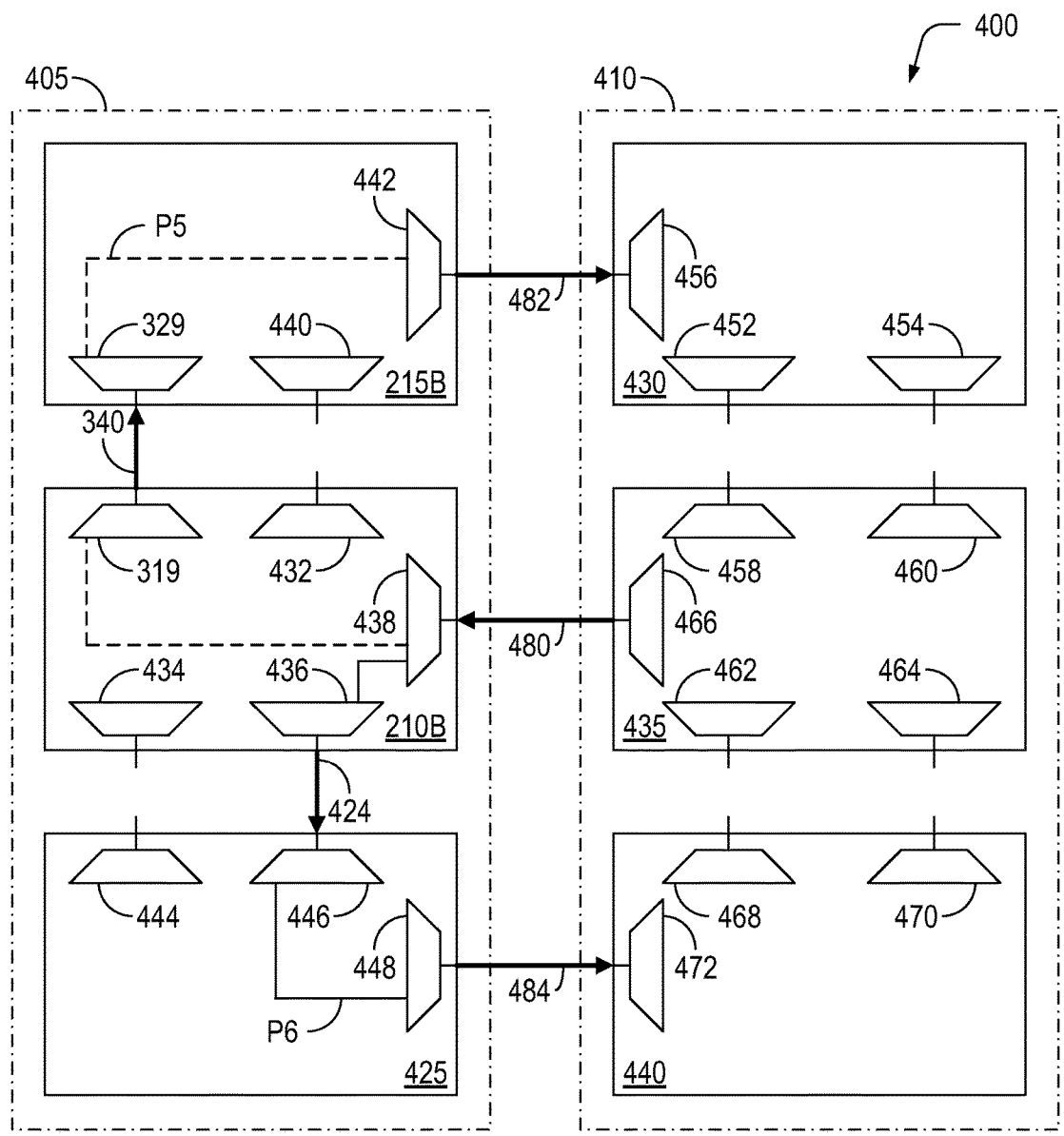
FIG. 4 depicts data representing an exemplary schematic of second portion of the circuit design depicted in FIG. 1 mapped initially between a multitude of FPGA including the multitude of SLR depicted in FIG. 3B, in accordance with one embodiment of the present invention.

FIG. 4 depicts data representing an exemplary schematic 400 of a second portion of circuit design 101 depicted in FIG. 1 mapped initially between a multitude of large FPGA 405, 410 including the multitude of SLR 210B, 215B depicted in FIG. 3B, in accordance with one embodiment of the present invention. Referring to FIG. 4, schematic 400 includes a multitude of large FPGA 405, 410. FPGA 405 includes a multitude of SLR 210B, 215B, 425. FPGA 410 includes a multitude of SLR 430, 435, 440. SLR 210B includes a multitude of multiplexers 319, 432, 434, 436, 438. SLR 215B includes a multitude of multiplexers 329, 440, 442. SLR 425 includes a multitude of multiplexers 444, 446, 448. SLR 430 includes a multitude of multiplexers 452, 454, 456. SLR 435 includes a multitude of multiplexers 458, 460, 462, 464, 466. SLR 440 includes a multitude of multiplexers 468, 470, 472.

Schematic 400 further includes a channel 480 between the pair of multiplexers 438, 466 which is assigned to a path P5 that may start somewhere in SLR 435. It is understood that some portions of paths, such as combinational logic if present, are not shown for clarity to focus on channel and path mapping. Recall that a path may cross multiple FPGA using a multitude of channels, but the path will usually cross an FPGA boundary as a net or wire since combinational logic is located in the FPGA. Channels as 480 used to cross from one FPGA to another FPGA may be referred to as "inter-FPGA" channels. Path P5 may be referred to as a "global path" because path P5 crosses between the multitude of FPGA 405, 410. Global path P5 continues across SLR 210B from multiplexer 438 to multiplexer 319 and crosses over from SLR 210B to SLR 215B via an inter-SLR channel 340 to multiplexer 329. Global path P5 continues across SLR 215B from multiplexer 329 to multiplexer 442 and crosses back over from FPGA 405 to FPGA 410 via an inter-FPGA channel 482 to multiplexer 456 in SLR 430.

Global path P5 may be mapped by compiler 103 so as to share channel 480 with a global path P6 using TDM through channel 480. Global path P6 may also start somewhere in SLR 435 and is mapped to continue across SLR 210B from multiplexer 438 to multiplexer 436 and crosses over from SLR 210B to SLR 425 via an inter-SLR channel 424 to multiplexer 446. Global path P6 continues across SLR 425 from multiplexer 446 to multiplexer 448 and crosses back over from FPGA 405 to FPGA 410 via an inter-FPGA channel 484 to multiplexer 472 in SLR 440.

Schematic 400 may be the result of performing a first mapping, i.e. partitioning and/or routing, using compiler 103 of computer 800, of the initial design data 101 to generate a first mapped data represented in-part by schematic 400, in accordance with a cost function and one or more nominal delays each associated with a different one of a multitude of global FPGA paths P5, P6 across an FPGA 405. One of the first multitude of global FPGA paths P5, P6 may include a critical path P5 characterized by a critical time delay associated with a maximum speed of hardware emulator or prototype system 102. The first cost function is associated with conserving the number of a multitude of interconnects 480-482 that interface with FPGA 405.

Figure 5:
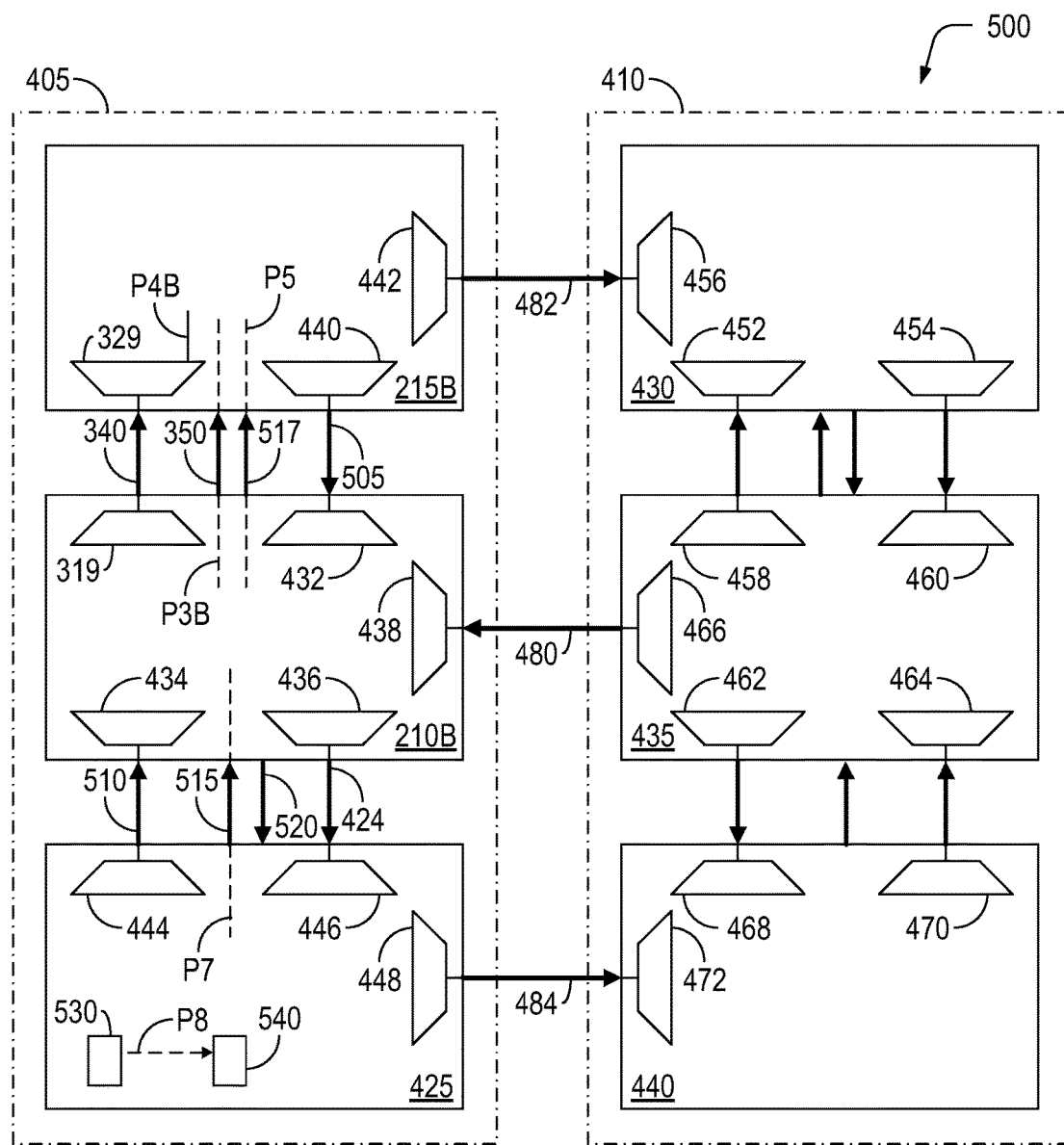
FIG. 5 depicts data representing the exemplary schematic of second portion of the circuit design depicted in FIG. 1 mapped again between the multitude of SLR depicted in FIG. 4, in accordance with one embodiment of the present invention.

FIG. 5 depicts data representing the exemplary schematic 500 of second portion of circuit design 101 depicted in FIG. 1 mapped a second time between the multitude of SLR 210B, 215B, 425 depicted in FIG. 4, in accordance with one embodiment of the present invention. The elements and functions depicted in FIG. 5 are the same as are depicted in FIG. 4 with the following exceptions. Referring to FIG. 5, inter-SLR channels 340, 350 are mapped between SLRs 210B, 215B so as to assign less-critical path P4B to channel 340 using TDM and critical path P3B to channel 350 without using TDM or sharing channel 350 with any other path as depicted in FIG. 3B.

Referring again to FIG. 5, FPGA 405 may further include a multitude of critical paths P7, P8. FPGA 405 may further include channel 505 using TDM between multiplexer 440 in SLR 215B and multiplexer 432 in SLR 210B, a channel 517 not using TDM between SLR 210B and SLR 215B, and a multitude of channels 510-520 between SLR 210B and SLR 425. Channel 510 may connect between pair of multiplexers 434, 444 and use TDM, while channels 515-520 do not use TDM and are mapped such that only a single wire is assigned to each channel. For example, channel 515 is assigned or mapped solely to the wire associated with critical path P7 without using TDM, and channel 517 is assigned solely to the wire associated with global critical path P5 without using TDM. Other path assignments, both critical and less-critical, within and/or between SLR may be mapped by compiler 103. For example, SLR 425 may include components 530 and 540 connected by critical path P8 disposed entirely within SLR 425 without crossing through any channel.

Schematic 500 may be the result of performing a second mapping (partitioning and/or routing), using compiler 103 of computer 800, of first mapped data represented in-part by schematic 400 to generate second mapped data represented in-part by schematic 500 in accordance with a second cost function and a multitude of required time delays each associated with a different one of a multitude of inter-SLR paths 340, 350, 424, 505-520 and the critical time delays associated with one or more critical paths P3B, P5, P7, P8 as described in more detail below.

Figure 6:
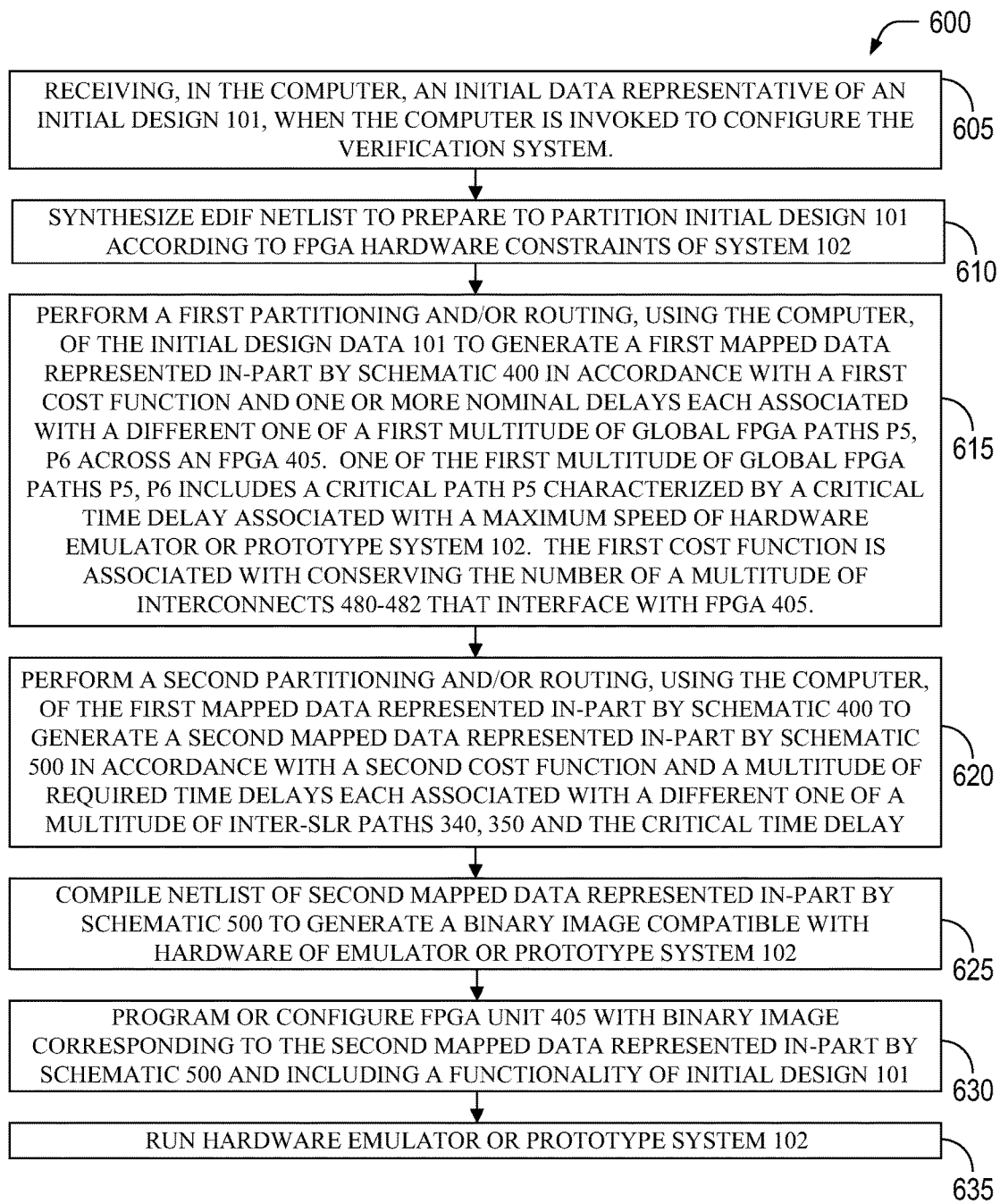
FIG. 6 depicts a simple exemplary flowchart for using a layered approach to map data associated with the second portion of the circuit design depicted in FIGS. 4-5 and configuring the hardware emulator or prototype system depicted in FIGS. 1-2, in accordance with one embodiment of the present invention.

FIG. 6 depicts a simple exemplary flowchart 600 for using a layered approach to map the data associated with schematics 400, 500 of the circuit design depicted in FIGS. 4-5 and configuring the hardware emulator or prototype system 102 depicted in FIGS. 1-2, in accordance with one embodiment of the present invention. Referring simultaneously to FIGS. 1, 6, flowchart 600 depicts compiler 103 in computer 800 receiving 605 an initial data representative of a circuit design 101, when the computer is invoked to configure hardware emulator or prototype system 102. Then, compiler 103 synthesizes 610 an EDIF netlist to prepare to partition initial circuit design 101 according to FPGA hardware constraints of hardware emulator or prototype system 102.

Referring simultaneously to FIGS. 1, 4, 6, compiler 103 performs 615 a first partitioning and/or routing, using compiler 103 in computer 800, of the data associated with initial circuit design 101 to generate a first mapped data represented in-part by schematic 400 of circuit design 101 in accordance with a first cost function and one or more nominal delays each associated with a different one of a first multitude of global FPGA paths P5, P6 across FPGA 405. Assume a nominal length in time, e.g. 40 ns, for each combinational path routed between a given large FPGA through an inter-FPGA channel, regardless of the actual inter-SLR connectivity. The first cost function is associated with conserving the number of a multitude of inter-FPGA channels 480-482 that interface with or connect to FPGA 405.

One of the first multitude of global FPGA paths P5, P6 includes global critical path P5 characterized by a critical time delay associated with a maximum speed of hardware emulator or prototype system 102. Compiler 103 guides the assignment of TDM to sockets inside FPGA 405 based on the global information on how a combinational path within given FPGA 405 is used in the context of the design's longest or critical path, e.g. P5. A nominal estimate for the distance of a path or combinational path, inside any given FPGA is usually within the same order of magnitude as in a mapping solution when there is no time multiplexing used along that path and the path has only one or two SLR crossing. Later it will be evident that paths that are global critical paths, e.g. P5, shall be biased not to cross between SLR or not to use TDM during inter-SLR crossings during the SLR partitioning step, which is why solving the global inter-FPGA routing problem provides an adequate estimate for the design's critical path, which in-turn allows defining required times for all combinational paths inside FPGA 405 as described later.

Compiler 103 solves a general routing problem when each combinational path, e.g. multitude of paths P5-P6 inside FPGA 405 is an edge in the corresponding timing graph and time multiplexing or TDM is introduced with respect only to inter-PFGA communication resources or inter-PFGA channels 480-484 using, for example, low-voltage differential sensing (LVDS).

While compiler 103 performs 615 a first partitioning and/or routing, slack of a net that is mapped to an inter-FPGA channel is computed and used to define the allowable time delay length or arrival time for the associated path that possibly crosses inter-SLR channels inside the FPGA nearest that inter-FPGA channel. In other words, slack of a net between two FPGA in the first level global partitioning and/or routing problem is used to determine the required time (and/or time bias for SLR partitioning) for paths when solving a second-level partitioning and/or routing problem inside the FPGA adjacent the inter-FPGA channel.

Once the first routing solution resulting in the first mapped data represented in-part by schematic 400 is calculated, each of the nets that cross FPGA boundaries or inter-FPGA channels, such as the nets associated with path P5 assigned to inter-FPGA channels 480, 482, and the nets associated with path P6 assigned to inter-FPGA channels 480, 484, are each made part of a different associated connectivity group each different group having a different multiplexing ratio associated with how many virtual wires are required at inter-FPGA channels 480-484, which in-turn implies a different associated time delay length, Tci, for each of the nets assigned at the associated inter-FPGA channel, where i represents one of the inter-FPGA channels 480-484. In one example, inter-PFGA channel 480 may include two virtual wires each requiring 5 ns to propagate through the channel, then Tc480=10 ns, while inter-PFGA channel 484 may include four virtual wires each requiring 5 ns then Tc484=20 ns.

Associated with a given path that has one or more FPGA boundary crossings, there is an amount of time delay length of that path, which is the time delay length associated with every FPGA boundary crossing along that path plus the time delay length associated with the portion of that path inside each FPGA along that path. The term "slack" in this context is the amount of time delay length greater than or equal to zero associated with every FPGA boundary crossing along the given path, such that the summation of values of all the slacks along that path plus the time delay length of that path is smaller than the time delay length of the critical path. In other words, the slacks are calculated such that the summation of values of all the slacks along that path plus the time delay length of that path is accomplished without increasing the time delay length of the critical path. Therefore, all slacks associated with the critical path are zero. There may be multiple nets on a given path that cross an FPGA boundary, each net having its associated different slack.

Continuing with the previous example, for a given path P that is mapped to inter-FPGA channels i, if the slack associated with an inter-FPGA channel i is Tsi, then if each Tsi associated with path P is added to each Tci associated with path P plus the nominal time delay length for path P, then no time delay length associated with path P shall exceed the time delay length of the current critical path P5. For path P6, which includes two FPGA-crossing nets assigned to channels 480, 484 respectively, then compiler 103 may calculate;

$Tc480+Ts480+Tc484+Ts484$+nominal time delay length for path $P6$=time delay length of $P5$.
Then substituting from above yields;

$Ts480+Ts484$+30 ns+nominal time delay length for path $P6$=time delay length of $P5$.

If the nominal time delay length for path P6 is 40 ns and if the time delay length of critical path P5 is 90 ns, then $Ts480+Ts484$+30 ns+40 ns=90 ns.

Therefore, the slack for path P6=Ts480+Ts484=20 ns.

Referring simultaneously to FIGS. 1, 4-6, compiler 103 next performs 620 a second partitioning and/or routing, using computer 800, of the first mapped data represented in-part by schematic 400 to generate a second mapped data represented in-part by schematic 500 in accordance with a second cost function and a multitude of required time delays each associated with a different one of a multitude of inter-SLR paths 340, 350 and the critical time delay associated with global critical path P5.

Compiler 103 applies the individual slack of an edge of the timing graph from solution of the first routing problem onto the corresponding multitude of paths within FPGA 405, in order to determine how much the length of delay associated with a selected path can be increased beyond the nominal estimate, e.g. 40 ns, before it begins to increase the length of delay associated with the current critical path, e.g. P5, of circuit design 101. Compiler 103 denotes the maximal length of delay associated with the selected path within FPGA 405 before starting to increase the length of delay associated with most critical path P5 as a "required delay," hereinafter also referred to as "required time," for the selected path.

Figure 7:
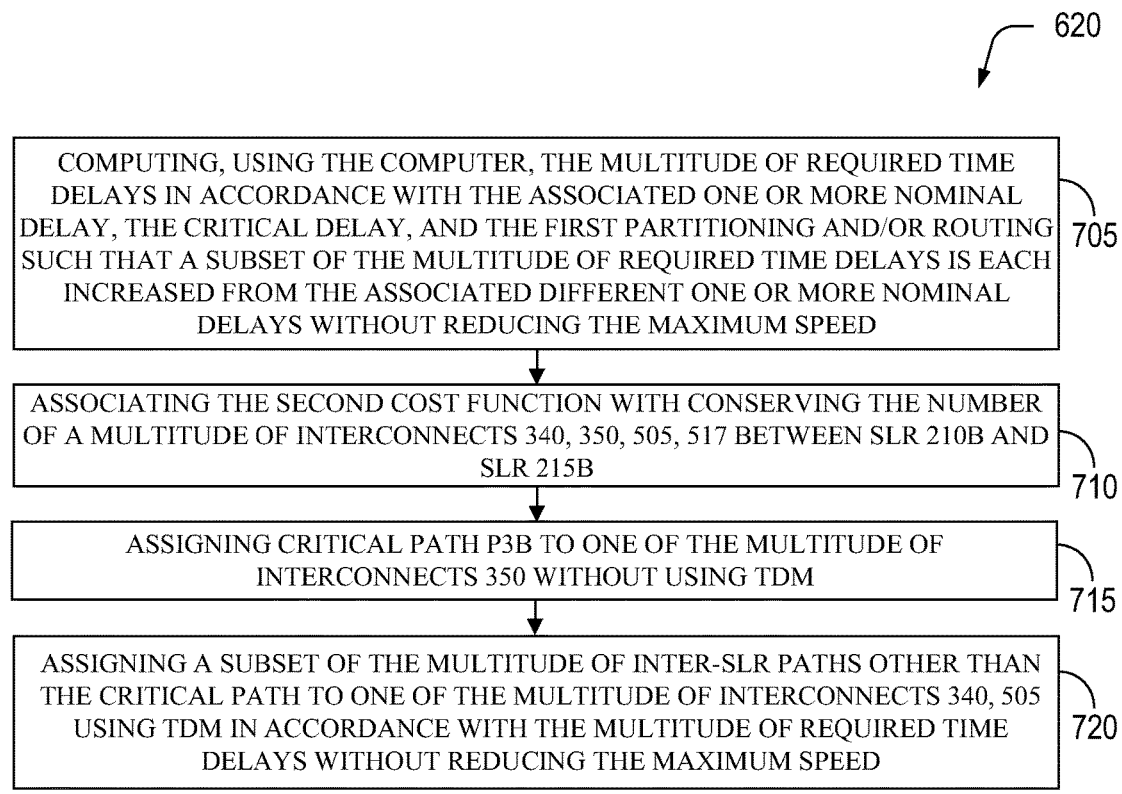
FIG. 7 depicts a simple exemplary flowchart for the step of performing the second mapping between the multitude of SLR depicted in FIG. 5, in accordance with one embodiment of the present invention.

FIG. 7 depicts a simple exemplary flowchart 620 for the step of performing the second mapping between the multitude of SLR 210B, 215B, 425 depicted in FIG. 5, in accordance with one embodiment of the present invention. Referring simultaneously to FIGS. 1, 4-7, compiler 103 computes 705, using computer 800, the multitude of required time delays in accordance with the associated one or more nominal delay, the critical delay time associated with critical path P5, and the first partitioning and/or routing, e.g. that results in first mapped data represented in-part by schematic 400 such that a subset of the multitude of required time delays is each increased from the associated different one or more nominal delays to the required time without exceeding the time delay length of the critical path or reducing the maximum speed of hardware emulator and/or prototype system 102.

Slack of a given net mapped on an inter-FPGA channel is used to increase the allowable arrival time for associated combinational paths inside the FPGA adjacent to that inter-FPGA channel. In other words, the slack associated with the inter-FPGA channel is used to allow longer propagation time for the associated path within the FPGA. Required times for paths within the FPGA are computed as described above to solve the partitioning and routing problem for paths that may include inter-SLR channels within the FPGA.

For example, for less than critical path P4B assume the initial time delay length may be 40 ns and the length of delay associated with critical path P5 may be 90 ns. Path P4B generates a wire "w" mapped to the nearest adjacent inter-FPGA channel 482 and has a calculated slack of 20 ns associated with inter-FPGA channel 482. Then the time delay length for path P4B may be increased from 40 ns to 40 ns+20 ns=60 ns for path P4B inside FPGA 405 before the time delay length associated with path P4B increases beyond the 90 ns time delay length of critical path P5. Therefore compiler 103 may determine the required time delay length for path P4B is 60 ns. Similarly, compiler 103 may assign each one of the multitude of paths in FPGA 405 to a corresponding different one of a multitude of required time delays. In other words, increasing the slack for P4B from the nominal time of 40 ns to 60 ns does not increase the overall speed of hardware emulator and/or prototype system 102. However, using the associated slack to increase the allowable time delay length or arrival time on P4B and other non-critical paths provides compiler 103 more flexibility in assignment of non-critical paths to channels using TDM, while assigning more critical paths P3B, P5, P7 to higher speed channels without using TDM.

Compiler 103 may associate 710 the second cost function with conserving the number of a multitude of interconnects 340, 350, 505, 517 between SLR 210B and SLR 215B. Compiler 103 may assign 715 or map critical path P3B to one of the multitude of interconnects 350 without using TDM. Compiler 103 may assign 720 or map a subset of the multitude of inter-SLR paths other than the critical path, e.g. path P4B, to one of the multitude of interconnects 340 that use TDM in accordance with the multitude of required time delays without exceeding the time delay length of the critical path or reducing the maximum speed of hardware emulator and/or prototype system 102.

Thereby, compiler 103 may partition a selected FPGA, e.g. FPGA 405, into a multitude of SLR 210B, 215B, 425 in accordance with the required time as estimated by compiler 103 for the combinational multitude of paths, e.g. P3B, P4B, P5-P8 inside FPGA 405. Paths with larger required time, e.g. less critical paths P4B, P6, are biased to be allowed to have more inter-SLR crossings than paths with smaller required time, e.g. more critical paths P3B, P5, P7, P8. Compiler 103 solves an instance of the routing problem within each FPGA when the routing is done between SLR based on the previously computed partitioning. Inter-SLR communication resources are subject to the time multiplexing paradigm, and a required time for each path inside the FPGA is computed as described above.

Referring simultaneously to FIGS. 1, 4-6, compiler 103 may next compile 625 a netlist of the second mapped data represented in-part by schematic 500 to generate a binary image compatible with hardware of emulator or prototype system 102. Compiler 103 may next program or configure 630 FPGA unit 405 with the binary image corresponding to the second mapped data represented in-part by schematic 500 and including a functionality of initial design 101.

The ability to independent define partitioning and routing problems within each FPGA separately allows solving those problems in parallel in compiler 103, thus providing significant compile time advantage. Solving an inter-SLR partitioning and routing problem on the global scale across all FPGA simultaneously may be infeasible with the available computing resources. It is noted that compiler 103 may perform steps in flow chart 600 in parallel in various combinations such as step 615 only, steps 615-620, steps 620 only, steps 620-625, and/or steps 615-630, and so on. After programming or configuring hardware of emulator or prototype system 102, the hardware emulator or prototype system 102 may be run 635 using wire to channel assignments that comprehend the timing requirements for critical paths even for inter-SLR wire to channel assignments, which in-turn results in higher maximum speed of hardware emulator or prototype system 102 and better compilation convergence than obtainable by previous techniques.

Figure 8:
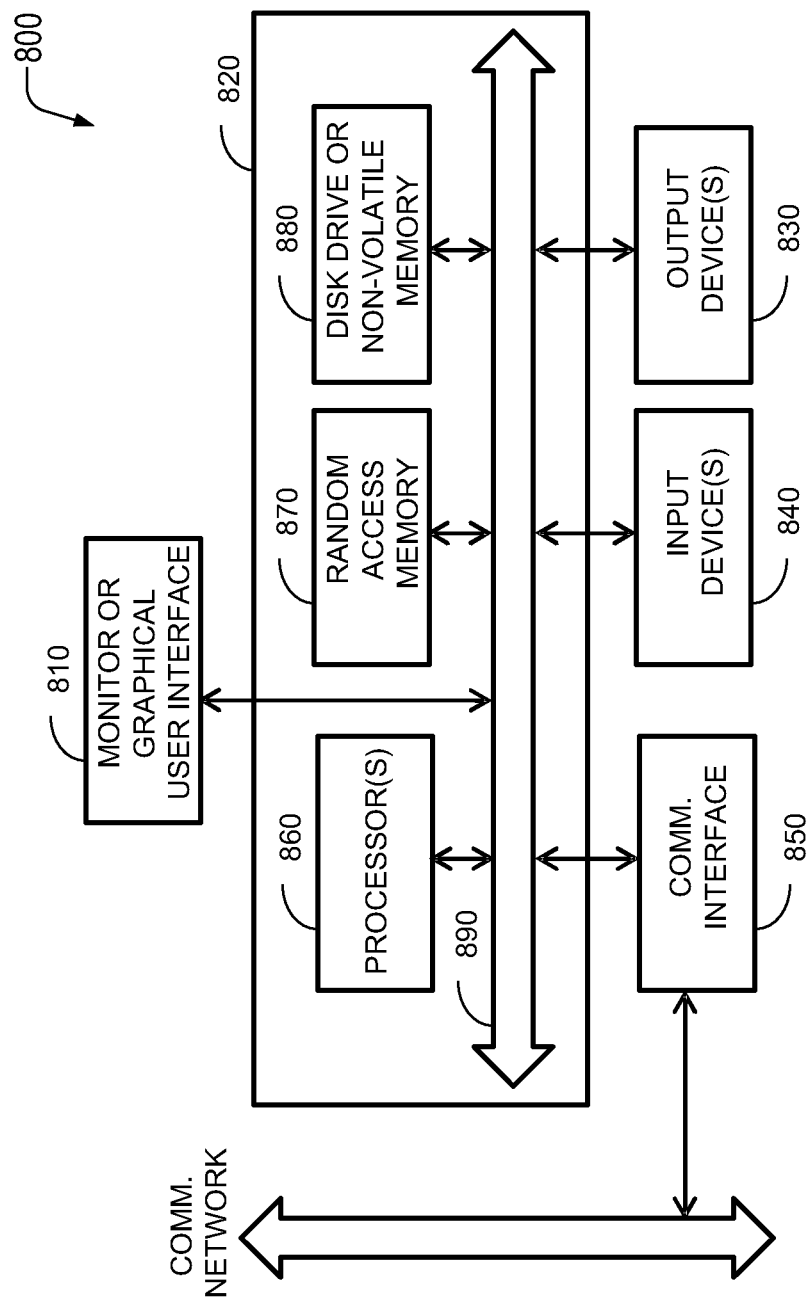
FIG. 8 depicts an example block diagram of a computer system that may incorporate embodiments of the present invention.

FIG. 8 is an example block diagram of a computer system 800 that may incorporate embodiments of the present invention. FIG. 8 is merely illustrative of an embodiment incorporating the present invention and does not limit the scope of the invention as recited in the claims. One of ordinary skill in the art would recognize other variations, modifications, and alternatives. In one embodiment, computer system 800 typically includes a monitor 810, a computer 820, user output devices 830, user input devices 840, communications interface 850, and the like.

As depicted in FIG. 8, computer 820 may include a processor(s) 860 that communicates with a number of peripheral devices via a bus subsystem 890. These peripheral devices may include user output devices 830, user input devices 840, communications interface 850, and a storage subsystem, such as random access memory (RAM) 870 and disk drive 880.

User input devices 840 include all possible types of devices and mechanisms for inputting information to computer 820. These may include a keyboard, a keypad, a touch screen incorporated into the display, audio input devices such as voice recognition systems, microphones, and other types of input devices. In various embodiments, user input devices 830 are typically embodied as a computer mouse, a trackball, a track pad, a joystick, wireless remote, drawing tablet, voice command system, eye tracking system, and the like. User input devices 840 typically allow a user to select objects, icons, text and the like that appear on the monitor 810 via a command such as a click of a button or the like.

User output devices 840 include all possible types of devices and mechanisms for outputting information from computer 820. These may include a display (e.g., monitor 810), non-visual displays such as audio output devices, etc.

Communications interface 850 provides an interface to other communication networks and devices. Communications interface 850 may serve as an interface for receiving data from and transmitting data to other systems. Embodiments of communications interface 850 typically include an Ethernet card, a modem (telephone, satellite, cable, ISDN), (asynchronous) digital subscriber line (DSL) unit, FireWire interface, USB interface, and the like. For example, communications interface 850 may be coupled to a computer network, to a FireWire bus, or the like. In other embodiments, communications interfaces 850 may be physically integrated on the motherboard of computer 820, and may be a software program, such as soft DSL, or the like.

In various embodiments, computer system 800 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 820 includes one or more Xeon microprocessors from Intel as processor(s) 860. Further, one embodiment, computer 820 includes a UNIX-based operating system.

RAM 870 and disk drive 880 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 870 and disk drive 880 may be configured to store the basic programming and data constructs that provide the functionality of the present invention.

Software code modules and instructions that provide the functionality of the present invention may be stored in RAM 870 and disk drive 880. These software modules may be executed by processor(s) 860. RAM 870 and disk drive 880 may also provide a repository for storing data used in accordance with the present invention.

RAM 870 and disk drive 880 may include a number of memories including a main random access memory (RAM) for storage of instructions and data during program execution and a read only memory (ROM) in which fixed non-transitory instructions are stored. RAM 870 and disk drive 880 may include a file storage subsystem providing persistent (non-volatile) storage for program and data files. RAM 870 and disk drive 880 may also include removable storage systems, such as removable flash memory.

Bus subsystem 890 provides a mechanism for letting the various components and subsystems of computer 820 communicate with each other as intended. Although bus subsystem 890 is depicted schematically as a single bus, alternative embodiments of the bus subsystem may utilize multiple busses.

FIG. 8 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A computer-implemented method for configuring a hardware verification system, the method comprising:
   receiving, in the computer, a first data representative of a first design, when the computer is invoked to configure the verification system;
   performing a first mapping, using the computer, of the first data to generate a second data in accordance with a first cost function and one or more first delays each associated with a different one of a first plurality of paths, wherein one of the first plurality of paths includes a critical path characterized by a second delay;
   performing a second mapping, using the computer, of the second data to generate a third data in accordance with a second cost function and a plurality of third delays each associated with a different one of a second plurality of paths and the second delay;

computing, using the computer, the plurality of third delays in accordance with the one or more first delays, the second delay, and the first mapping such that a subset of the plurality of third delays is each increased from the associated different one or more first delays without exceeding the second delay; and configuring the hardware verification system when the third data is compiled and programmed into the hardware verification system.

2. The computer-implemented method of claim 1, wherein the first mapping is an operation selected from the group consisting of partitioning, and routing.

3. The computer-implemented method of claim 1, wherein the second mapping is an operation selected from the group consisting of partitioning, and routing.

4. The computer-implemented method of claim 1, wherein the third data includes a functionality of the first design.

5. The computer-implemented method of claim 1, wherein the second data includes at least a first logic circuit and a subset of the first plurality of paths is disposed across the first logic circuit, the first cost function being associated with conserving the number of a plurality of interconnects that interface with the first logic circuit.

6. The computer-implemented method of claim 5, wherein the first logic circuit includes a plurality of second logic circuits selected from the group consisting of field programmable gate arrays (FPGA), configurable hardware logic (CHI), and super logic region (SLR).

7. The computer-implemented method of claim 1, wherein performing the second mapping includes assigning the critical path to one of a plurality of interconnects without using time multiplexing.

8. The computer-implemented method of claim 1, wherein the second delay is associated with a maximum speed of the hardware verification system.

9. The computer-implemented method of claim 1, wherein performing the second mapping includes assigning a subset of the second plurality of paths other than the critical path to one of a plurality of interconnects using time multiplexing in accordance with the plurality of third delays without exceeding the second delay.

10. The computer-implemented method of claim 1, wherein the second data includes at least a first logic circuit, wherein the third data includes a second logic circuit and a third logic circuit disposed in the first logic circuit, the second cost function being associated with conserving the number of a plurality of interconnects between the second logic circuit and the third logic circuit.

11. The computer-implemented method of claim 10, wherein the second logic circuit is a first super logic region (SLR) and the third logic circuit is a second SLR different from the first SLR.

12. The computer-implemented method of claim 10, wherein a subset of the second plurality of paths is disposed so as to cross between the second logic circuit and the third logic circuit.

13. A non-transitory computer-readable storage medium comprising instructions, which when executed by a computer, cause the computer to:

receive a first data representative of a first design, when the computer is invoked to configure the verification system;

perform a first mapping of the first data to generate a second data in accordance with a first cost function and one or more first delays each associated with a different one of a first plurality of paths, wherein one of the first plurality of paths includes a critical path characterized by a second delay;

perform a second mapping of the second data to generate a third data in accordance with a second cost function and a plurality of third delays each associated with a different one of a second plurality of paths and the second delay;

compute the plurality of third delays in accordance with the one or more first delays, the second delay, and the first mapping such that a subset of the plurality of third delays is each increased from the associated different one or more first delays without exceeding the second delay; and configure the hardware verification system when the third data is compiled and programmed into the hardware verification system.

14. A computer system operative to:

receive a first data representative of a first design, when the computer is invoked to configure the verification system;

perform a first mapping of the first data to generate a second data in accordance with a first cost function and one or more first delays each associated with a different one of a first plurality of paths, wherein one of the first plurality of paths includes a critical path characterized by a second delay;

perform a second mapping of the second data to generate a third data in accordance with a second cost function and a plurality of third delays each associated with a different one of a second plurality of paths and the second delay;

compute the plurality of third delays in accordance with the one or more first delays, the second delay, and the first mapping such that a subset of the plurality of third delays is each increased from the associated different one or more first delays without exceeding the second delay; and configure the hardware verification system when the third data is compiled and programmed into the hardware verification system.

15. The computer system of claim 14, wherein the first mapping is an operation selected from the group consisting of partitioning, and routing.

16. The computer system of claim 14, wherein the second mapping is an operation selected from the group consisting of partitioning, and routing.

17. The computer system of claim 14, wherein the third data includes a functionality of the first design.

18. The computer system of claim 14, wherein the second data includes at least a first logic circuit and a subset of the first plurality of paths is disposed across the first logic circuit, the first cost function being associated with conserving the number of a plurality of interconnects that interface with the first logic circuit.

19. The computer system of claim 18, wherein the first logic circuit includes a plurality of second logic circuits selected from the group consisting of field programmable gate arrays (FPGA), configurable hardware logic (CHL), and super logic region (SLR).

20. The computer system of claim 14, wherein performing the second mapping includes assigning the critical path to one of a plurality of interconnects without using time multiplexing.

21. The computer system of claim 14, wherein the second delay is associated with a maximum speed of the hardware verification system.

22. The computer system of claim 14, wherein performing the second mapping includes assigning a subset of the second plurality of paths other than the critical path to one of a plurality of interconnects using time multiplexing in accordance with the plurality of third delays without exceeding the second delay.

23. The computer system of claim 14, wherein the second data includes at least a first logic circuit, wherein the third data includes a second logic circuit and a third logic circuit disposed in the first logic circuit, the second cost function being associated with conserving the number of a plurality of interconnects between the second logic circuit and the third logic circuit.

24. The computer system of claim 23, wherein the second logic circuit is a first super logic region (SLR) and the third logic circuit is a second SLR different from the first SLR.

25. The computer system of claim 23, wherein a subset of the second plurality of paths is disposed so as to cross between the second logic circuit and the third logic circuit.

\* \* \* \* \*